United States Patent

Barnham

[11] Patent Number: 5,496,415
[45] Date of Patent: Mar. 5, 1996

[54] CONCENTRATOR SOLAR CELL HAVING A MULTI-QUANTUM WELL SYSTEM IN THE DEPLETION REGION OF THE CELL

[75] Inventor: Keith Barnham, Surrey, United Kingdom

[73] Assignee: Imperial College of Science, Technology and Medicine, London, Great Britain

[21] Appl. No.: 211,850
[22] PCT Filed: Oct. 19, 1992
[86] PCT No.: PCT/GB92/01913
§ 371 Date: Aug. 24, 1994
§ 102(e) Date: Aug. 24, 1994
[87] PCT Pub. No.: WO93/08606
PCT Pub. Date: Apr. 29, 1993

[30] Foreign Application Priority Data

Oct. 18, 1991 [GB] United Kingdom ............. 9122197

[51] Int. Cl.$^6$ .................................................. H01L 31/06
[52] U.S. Cl. .......................... 136/255; 136/258; 136/262; 257/15; 257/16; 257/17; 257/21; 257/22
[58] Field of Search ...................... 136/255, 258 AM, 136/262; 257/15–17, 21–22, 458

[56] References Cited

U.S. PATENT DOCUMENTS

| 4,250,515 | 2/1981 | Esaki et al. | 257/15 |
| 4,255,211 | 3/1981 | Fraas | 136/249 |
| 4,688,068 | 8/1987 | Chaffin et al. | 136/249 |
| 4,975,567 | 12/1990 | Bishop et al. | 250/214.1 |

FOREIGN PATENT DOCUMENTS

| 62-282468 | 12/1987 | Japan | 136/258 AM |
| 1-280367 | 11/1989 | Japan | 136/258 |

OTHER PUBLICATIONS

K. W. J. Barnham et al, *J. Appl. Phys.*, vol. 67, Apr. 1990, pp. 3490–3493.
E. E. Mendez et al, *Appl. Phys. Lett.*, vol. 45, Aug. 1984, pp. 294–296.

Primary Examiner—Aaron Weisstuch
Attorney, Agent, or Firm—Fay, Sharpe, Beall, Fagan, Minnich & McKee

[57] ABSTRACT

A solar cell formed from a semiconductor having a relative wide band-gap $E_b$, characterized by a multi-quantum well system incorporated in the depletion region of the cell in which the quantum wells comprise regions of semiconductor with a smaller band gap separated by small amounts of the wider band-gap semiconductor ($E_b$) so that the effective band-gap for absorption ($E_a$) is less than $E_b$.

12 Claims, 1 Drawing Sheet

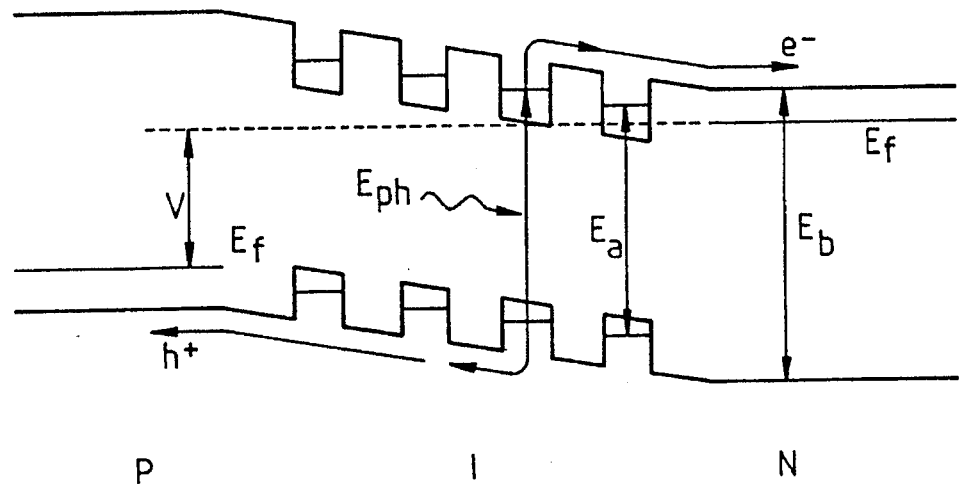

FIG. 1

FIG. 2(a)

| GaAs cap |
| --- |
| 150nm p doped AlGaAs |
| 510nm undoped AlGaAs<br>8·5nm quantum wells<br>6·4 nm barriers |
| 460nm n doped AlGaAs |
| GaAs buffer and substrate |

FIG. 2(b)

| GaAs cap + AlGaAs window |
| --- |
| 150nm p doped AlGaAs |
| 810nm undoped AlGaAs<br>8·5nm quantum wells<br>6·4nm barriers |
| 460nm n doped AlGaAs |
| GaAs buffer and substrate |

FIG. 2(c)

| GaAs cap |
| --- |
| 150nm p doped AlGaAs |
| 1250nm undoped AlGaAs<br>8·5nm quantum wells<br>6·4nm barriers |
| 460nm n doped AlGaAs |
| GaAs buffer and substrate |

CONCENTRATOR SOLAR CELL HAVING A MULTI-QUANTUM WELL SYSTEM IN THE DEPLETION REGION OF THE CELL

This invention relates to a concentrator solar cell.

The widespread application of solar cells for electricity generation is mainly limited by the restricted energy conversion efficiency of present day solar cells and by their expense. It is accepted that the use of light concentrators can reduce significantly the overall cost of a solar cell system. However a major problem is that the concentration of light makes the solar cell much hotter, and the energy conversion efficiency of a conventional solar cell falls as temperature rises.

According to the present invention a solar cell constructed from a semi-conductor of band-gap $E_b$ has a multi-quantum well system formed by the addition, in the depletion region of the cell, of small amounts of a semi-conductor with a smaller band-gap separated by small amounts of the wider band-gap semi-conductor so that the effective band-gap for absorption ($E_a$) is less that $E_b$. The band gaps are chosen so that at room temperature the quantum efficiency for the collection of charged carriers produced by light absorbed in the wells is considerably less than 100%. In addition the band-gaps are chosen so that at the higher operating temperature under concentration this quantum efficiency rises close to 100%. If appropriately designed the energy conversion efficiency of the present invention will rise with increase of temperature whereas it falls in a conventional solar cell. By suitable choice of $E_a$ and $E_b$ it will be possible to ensure that the charged carriers produced by light absorbed in the wells are collected at higher potential difference than in an equivalent conventional solar cell as a result of the absorption of thermal energy from interaction with phonons at the operating temperature.

Since these devices are effectively capable of converting heat energy as well as light energy, they have considerable potential for a much wider range of applications such as "thermionic generators" and solid-state self-refrigeration elements or "heat pumps".

A specific embodiment of the invention will now be described by way of example with reference to the accompanying drawings, in which:

FIG. 1 is a schematic of the energy band variation across the depletion region of a p-i-n solar cell of band-gap $E_b$; and FIGS. 2(a), 2(b), and 2(c) are diagrams illustrating the dimensions of layers of various experimental devices.

In FIG. 1, the intrinsic (i) region contains a number (for example, 30–100 represented schematically in the figure) of quantum wells formed by small amounts of a lower band-gap semiconductor between small amounts of the solar cell semiconductor of band-gap $E_b$. Light with energy $E_{ph}$ greater than the effective band-gap for absorption ($E_a$) is absorbed in the wells forming electron and hole pairs. In the presence of the built-in electric field in the depletion region and providing the temperature is high enough the electrons and holes escape from the wells and are separated by the electric field to form a current I at a forward bias V and hence produce useful power IV.

FIGS. 2(a), 2(b), and 2(c) are exemplary devices constructed for experimental purposes. The aluminium fraction is 33% in all cases for the AlGaAs, and the quantum wells are formed from GaAs.

Suitable structures could be constructed with combinations or binary semiconductors and alloys from Groups III and V of the periodic table. In addition, quantum well systems could be made from Group IV alloys (e.g. Si and Ce) and Group II and Group VI alloys (e.g. Cd,Hg and Se,Te).

One possibility is to use $Al_xGa_{1-x}As$ as the barrier material and $In_yGa_{1-y}As$ as the narrower band-gap material, for example $Al_{0.3}Ga_{0.7}As$ ($E_b$ about 1.8 eV), with the narrower band-gap material being $In_{0.15}Ga_{0.85}As$ with $E_a$ about 1.2 eV. Under concentrated sunlight the temperature of such a cell would be expected to rise by about 80° C. Even allowing for the increase in efficiency which results from the higher light levels under concentration, the theoretical efficiency of a conventional GaAs cell would be expected to fall from 25% to 22% in this situation. The intrinsic region of the concentrator cell proposed here should be of sufficient quality so that the built-in electric field is maintained into forward bias and so that the non-radiative recombination lifetime of the carriers generated in the wells is long. If so, the quantum efficiency for collection of carriers absorbed in the wells will increase from around 30% at room temperature to above 90% at a temperature 80° C. above. On this basis, it is anticipated that efficiencies higher than 30% should be possible in the invention described here.

In a typical construction the wells and the intervening barriers are both 5 to 10 nm wide and the intrinsic region is 500 to 1500 nm wide, these dimensions being measured perpendicular to the planes of the junctions.

As a further alternative, a combination of InGaAs wells matched to InP barriers may be expected to provide good results as InP is a good conventional solar cell material and the "well depths" would be about twice those in the AlGaAs/GaAs system.

I claim:

1. A solar cell formed from a semiconductor having a relatively wide band-gap $E_b$, characterized by a multi-quantum well system incorporated in the depletion region of the cell, in which the quantum wells comprise regions of semiconductor with a smaller band gap separated by small amounts of the wide band-gap semiconductor ($E_b$) so that an effective band-gap for absorption ($E_a$) is less than $E_b$; characterized in that the quantum wells are sufficiently deep to ensure that electrons and holes trapped in the quantum wells cannot escape at normal room temperature but are energized to higher levels at higher temperatures so that an energy conversion efficiency of the solar cell is correspondingly increased.

2. A solar cell according to claim 1 comprising a p-i-n device, the quantum wells being incorporated in an intrinsic region of the p-i-n device, so that a built-in electric field is maintained in a forward bias region and a recombination lifetime of carriers generated in the wells is long.

3. A solar cell according to claim 1 wherein the band gaps are chosen so that, at room temperature, the quantum efficiency for collection of charged carriers produced by light absorbed in the wells is considerably less than 100%.

4. A solar cell according to claim 1 wherein the wide band gap material is $Al_xGa_{1-x}As$ and the smaller band gap material is $In_yGa_{1-y}As$.

5. A solar cell according to claim 1 wherein the wide band gap material is InP and the smaller band gap material is InGaAs.

6. A solar cell according to claim 1 wherein the multi-quantum well system includes 30 to 100 quantum wells.

7. A solar cell according to claim 6 in which the wells are 5 to 20 nm wide and the intervening barriers are also 5 to 20 nm wide.

8. A solar cell according to claim 7 in which the intrinsic region is in the range of 500 to 1500 nm wide.

9. A semiconductor device particularly adapted for use as a concentrator solar cell or other energy conversion applications comprising a semiconductor material having quantum wells of sufficient depth to trap substantially all photon-generated carriers, whereby the trapped carriers will then absorb photon energy and escape from the quantum wells to produce a current.

10. A solar cell according to claim 9 wherein the semiconductor material includes 30 to 100 quantum wells.

11. A solar cell according to claim 10 wherein the quantum wells are 5 to 20 nm wide and the intervening barriers are also 5 to 20 nm wide.

12. A solar cell according to claim 11 wherein the intrinsic region is in the range of 500 to 1500 nm wide.

* * * * *